(12) United States Patent
Yokota et al.

(10) Patent No.: US 8,492,292 B2
(45) Date of Patent: Jul. 23, 2013

(54) METHODS OF FORMING OXIDE LAYERS ON SUBSTRATES

(75) Inventors: Yoshitaka Yokota, San Jose, CA (US); Christopher S. Olsen, Fremont, CA (US); Agus Sofian Tjandra, San Jose, CA (US); Yonah Cho, Sunnyvale, CA (US); Matthew S. Rogers, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 305 days.

(21) Appl. No.: 12/820,395

(22) Filed: Jun. 22, 2010

(65) Prior Publication Data

US 2010/0330814 A1    Dec. 30, 2010

Related U.S. Application Data

(60) Provisional application No. 61/221,321, filed on Jun. 29, 2009.

(51) Int. Cl.
*H01L 21/314* (2006.01)

(52) U.S. Cl.
USPC ........... 438/771; 438/770; 438/795; 438/798; 257/E21.266

(58) Field of Classification Search
USPC ................................. 438/771; 257/E21.266
See application file for complete search history.

(56) References Cited

U.S. PATENT DOCUMENTS

| | | | |
|---|---|---|---|
| 5,412,246 A | 5/1995 | Dobuzinsky et al. | |
| 6,103,567 A | 8/2000 | Shih et al. | |
| 6,294,476 B1 * | 9/2001 | Lin et al. | 438/725 |
| 6,303,192 B1 | 10/2001 | Annapragada et al. | |
| 6,329,237 B1 * | 12/2001 | Kim et al. | 438/240 |
| 6,649,538 B1 * | 11/2003 | Cheng et al. | 438/775 |
| 6,723,666 B1 | 4/2004 | En et al. | |
| 7,736,993 B2 * | 6/2010 | Allibert et al. | 438/455 |
| 2005/0227432 A1 * | 10/2005 | Choi et al. | 438/244 |
| 2006/0246738 A1 * | 11/2006 | Isobe et al. | 438/769 |
| 2007/0245957 A1 | 10/2007 | Belyansky et al. | |
| 2007/0281448 A1 | 12/2007 | Chen et al. | |
| 2008/0119057 A1 * | 5/2008 | Chua et al. | 438/763 |
| 2009/0047778 A1 | 2/2009 | Sasaki | |
| 2009/0311877 A1 | 12/2009 | Olsen et al. | |
| 2010/0093186 A1 | 4/2010 | Kobayashi et al. | |

FOREIGN PATENT DOCUMENTS

KR    10-2002-0081902 A    10/2002

OTHER PUBLICATIONS

Quirk, et al., Semiconductor Manufacturing Technology, 2001, Prentice Hall, p. 231.
International Search Report and Written Opinion mailed Jan. 24, 2011 for PCT application No. PCT/US2010/039753.
Extended European Search Report mailed Feb. 13, 2013 for European Patent Application No. EP10800248.6.

\* cited by examiner

*Primary Examiner* — Angel Roman
(74) *Attorney, Agent, or Firm* — Moser Taboada; Alan Taboada

(57) ABSTRACT

Methods for processing substrates are provided herein. In some embodiments, a method for processing a substrate includes providing a substrate having an oxide layer disposed thereon, the oxide layer including one or more defects; and exposing the oxide layer to a plasma formed from a process gas comprising an oxygen-containing gas to repair the one or more defects. In some embodiments, the oxide layer may be formed on the substrate. In some embodiments, forming the oxide layer further comprises depositing the oxide layer atop the substrate. In some embodiments, forming the oxide layer further comprises thermally oxidizing the surface of the substrate to form the oxide layer. In some embodiments, a processing temperature is maintained at about 700 degrees Celsius or below during the thermal oxidation of the surface.

19 Claims, 3 Drawing Sheets

METHODS OF FORMING OXIDE LAYERS ON SUBSTRATES

CROSS-REFERENCE TO RELATED APPLICATIONS

This application claims benefit of U.S. provisional patent application Ser. No. 61/221,321, filed Jun. 29, 2009, which is herein incorporated by reference in its entirety.

FIELD

Embodiments of the present invention generally relate to methods of processing substrates.

BACKGROUND

Oxide layers may be utilized in semiconductor devices, photovoltaic cells, light emitting diodes (LEDs) or the like as an insulating layer, such as a dielectric layer. Accordingly, oxide layers are required to have, for example, suitable dielectric properties and layer quality to prevent leakage between conducting layers, such as between the channel and gate of a transistor device. Typically, oxide layers thermally grown at high temperatures (e.g., >700 degrees Celsius) exhibit suitable dielectric properties and layer quality. Unfortunately, reduced thermal budgets and more stringent critical dimension requirements make high temperature thermal growth processes unsuitable for advanced device nodes (in a non-limiting example, at 45 nanometer technology nodes and less—having a width of about 320 Angstroms or less—according to the International Technology Roadmap for Semiconductors (ITRS).

Accordingly, to meet advanced device requirements, oxide layers may be thermally grown at lower temperatures (e.g., <700 degrees Celsius), or deposited at low pressures (which may vary depending upon the process used). Unfortunately, the quality of oxide layers formed under such processing conditions is poor and typically results defects in the oxide layer.

Thus, there is a need in the art for improved methods for forming oxide layers.

SUMMARY

Methods for processing substrates are provided herein. In some embodiments, for a method for processing a substrate includes providing a substrate having an oxide layer disposed thereon, the oxide layer including one or more defects; and exposing the oxide layer to a plasma formed from a process gas comprising an oxygen-containing gas to repair the one or more defects. In some embodiments, the oxide layer having one or more defects may be formed on the substrate. In some embodiments, forming the oxide layer further comprises depositing the oxide layer atop the substrate or atop a semiconductor device disposed on the substrate.

In some embodiments, forming the oxide layer further comprises thermally oxidizing the surface of the substrate or of a device disposed on the substrate to form the oxide layer. In some embodiments, a processing temperature is maintained at about 700 degrees Celsius or below during the thermal oxidation of the surface. Other and further embodiments of the present invention are described below.

In some embodiments, a method for processing a substrate may include providing a substrate having an oxide layer disposed thereon; and treating the oxide layer with a plasma formed from a process gas comprising an oxygen-containing gas. In some embodiments, providing the substrate may further include forming the oxide layer on the substrate to a desired thickness.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
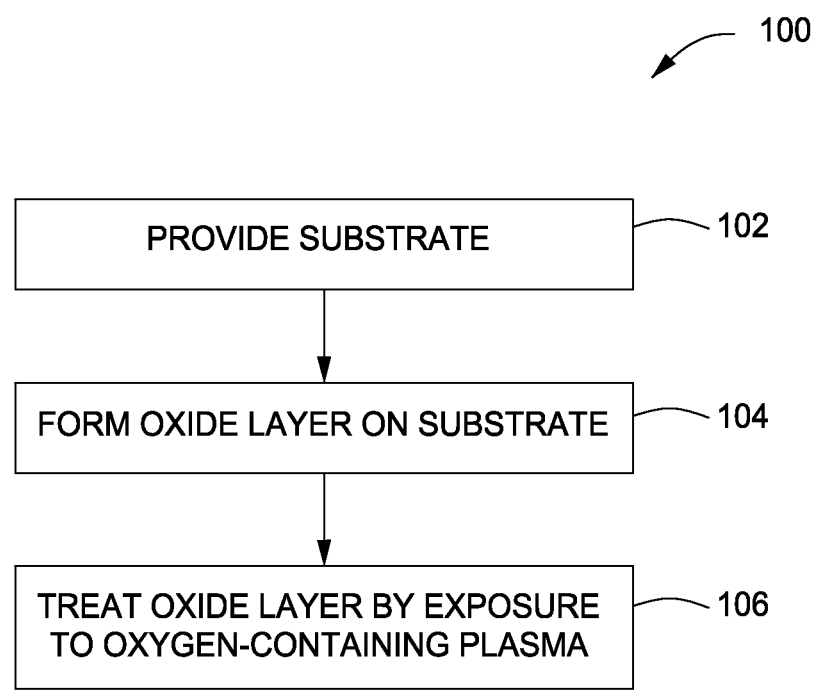
FIG. 1 depicts a flow chart of a method for processing a substrate in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Methods for processing substrates are provided herein. The inventive methods include the formation of an oxide layer compatible with thermal budget and critical dimension requirements of advanced device nodes. The inventive methods advantageously provide an oxide layer having improved dielectric properties, layer quality, and formed to a desired layer thickness using a reduced thermal budget.

Figure 2A:
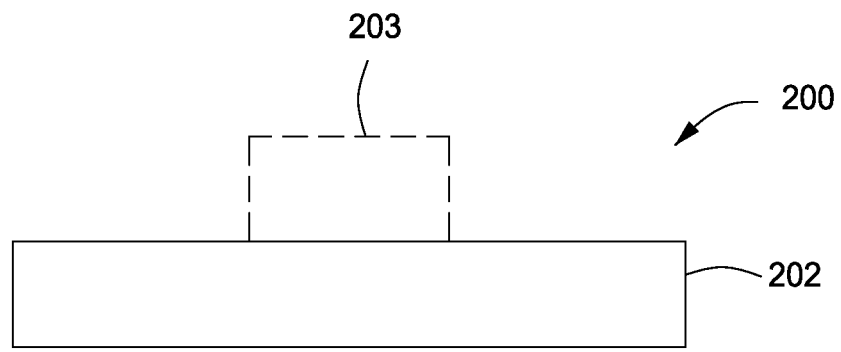
FIGS. 2A-C illustrate stages of fabrication of a semiconductor structure in accordance with some embodiments of the present invention.
Figure 2B:
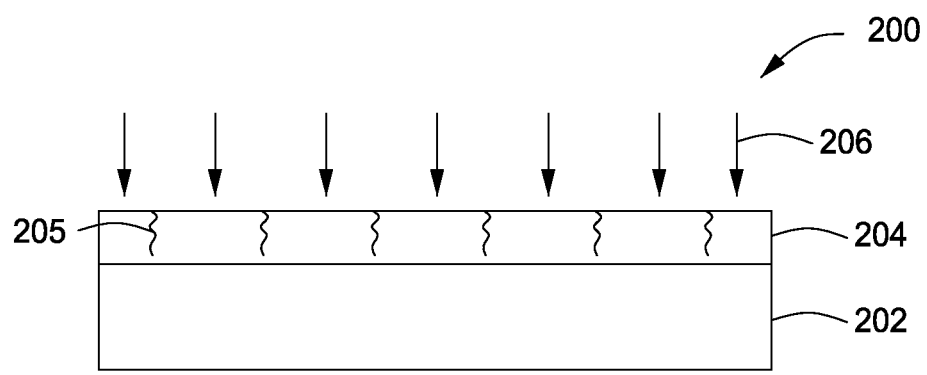
Figure 2C:
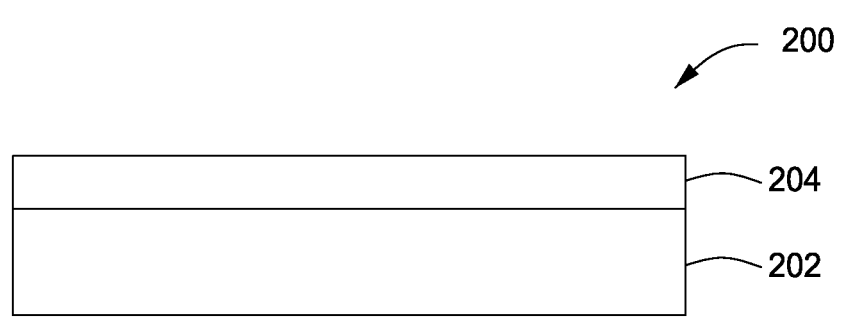

FIG. 1 depicts an illustrative method 100 for forming an oxide layer in accordance with embodiments of the present invention. The method 100 is described herein with respect to the structure depicted in FIGS. 2A-C and may be performed, for example, in a suitable reactor, such as is described below with respect to FIG. 3. For example, FIGS. 2A-C depict stages of fabrication of a semiconductor structure 200 including an oxide layer 206 formed over a semiconductor substrate 202.

The method 100 begins at 102 by providing a substrate 202 (depicted in FIG. 2A) on which an oxide layer of the present invention may be formed. The substrate 202 may be a substrate as used in the fabrication of semiconductor devices, solar and photovoltaic cells, LED, OLED, digital displays, or the like, and may have various dimensions, such as 200 or 300 mm diameter wafers, rectangular or square panels, or the like. The substrate 202 may comprise a material such as crystalline silicon (e.g., Si<100> or Si<111>), silicon oxide, strained silicon, silicon germanium, doped or undoped polysilicon, doped or undoped silicon wafers, patterned or non-patterned wafers, silicon on insulator (SOI), carbon doped silicon oxides, silicon nitride, doped silicon, germanium, gallium arsenide, glass, sapphire, or other suitable substrate upon which an oxide layer is to be formed.

The substrate 202 may have one or more features 203 formed thereon. The feature 203 may include one or more devices, film stacks, gate electrodes, or combinations thereof.

For example, such devices may include one or more of a transistor, a light emitting diode (LED), a photovoltaic cell, a non-volatile memory device (e.g., Flash memory), or a volatile memory device (e.g., DRAM memory).

In some embodiments, the feature 203 on the substrate 202 may be a film stack (not shown). Such a film stack may be any stack of materials to be oxidized that may benefit from the present invention. For example, in some embodiments, such as in flash memory applications, the film stack may be a gate stack of a flash memory cell comprising a tunnel oxide layer, a floating gate layer, a single or multi-layer dielectric layer comprising the Interpoly Dielectric (IPD) (a non-limiting example of the IPD is a multi-layer ONO layer comprising a nitride layer disposed between a first and second oxide layer), and a control gate layer. The oxide layers typically comprise silicon and oxygen, such as silicon oxide ($SiO_2$), silicon oxynitride (SiON), or the like. The nitride layer typically comprises silicon and nitrogen, such as silicon nitride (SiN), or the like. In some embodiments, a multi-layer comprising $SiO_2/Al_2O_3/SiO_2$ can also be used as the IPD layer. The floating gate layer and the control gate layer typically comprise a conductive material, such as polysilicon, metals, or the like. Other film stacks in other applications may be advantageously oxidized in accordance with the teachings provided herein, such as dynamic random access memory (DRAM) metal electrode/polysilicon gate stacks, Charge Trap Flash (CTF) for Non-volatile Memory (NVM), or the like. The DRAM metal electrode is typically tungsten (W) with interlayers of titanium nitride (TiN) or tungsten nitride (WN) between the tungsten and polysilicon layers. Charge Trap Flash (CTF) for Non-volatile Memory (NVM) uses a $SiO_2/SiN/Al_2O_3$ gate stack with a metal electrode of tantalum nitride (TaN) or titanium nitride (TiN) that may also benefit from sidewall oxidation after gate etch.

In some embodiments, as depicted in FIG. 2B, the substrate 202 may have an oxide layer 204 disposed thereon that may include one or more defects 205, discussed in more detail below. The oxide layer 204 may be disposed on the substrate 202, the feature 203 (not shown), or both the substrate 202 and the feature 203 (not shown). Alternatively, at 104, the oxide layer 204 may be formed on the substrate 202, the feature 203, or both the substrate 202 and the feature 203.

The oxide layer 204 may be any suitable oxide layer utilized with semiconductor devices. For example, the oxide layer 204 may be a high-k dielectric layer forming the gate oxide of a logic device such as a metal oxide semiconductor field effect transistor (MOSFET) or a Flash memory device, a high-k dielectric layer disposed between the electrodes of a DRAM capacitor, or the like. Exemplary materials forming the oxide layer 204 may include hafnium oxide ($HfO_2$), hafnium silicon oxide ($HfSiO_x$), hafnium silicon oxynitride ($HfSiO_xN_y$), aluminum oxide ($Al_2O_3$), silicon oxide ($SiO_2$), silicon oxynitride (SiON), and the like. The oxide layer 204 may be formed to a thickness of up to about 80 Angstroms, or between about 5 to about 200 Angstroms using either a thermal oxidation or deposition process discussed below.

The oxide layer 204 may be formed by any oxidation process capable of meet the thermal budget and critical dimension requirements of advanced device nodes (e.g., a first process). Suitable oxidation processes may include thermal oxidation at low temperature (e.g., <700 degrees Celsius), low pressure chemical vapor deposition (LPCVD), atomic layer deposition (ALD), plasma enhanced chemical vapor deposition (PECVD), or combinations thereof.

The oxide layer 204 may be formed by an oxidation process that oxidizes a surface of the substrate 202, such as a thermal oxidation process which consumes a portion of the substrate proximate the surface to form the oxide layer 204. For example, in some embodiments, the oxide layer 204 may be formed thermally in an oxygen-containing environment.

Using a thermal oxidation process, the oxide layer 204 may be formed by maintaining the substrate at processing temperature of about 700 degrees Celsius or below during the thermal oxidation process (although greater temperatures may be used). At these lower temperatures, several effects may be minimized in the semiconductor structure 200, such as oxide diffusion at the interface of adjacent layers (e.g., bird's beak), reduction of grain coarsening in polysilicon gate structures (e.g., gate electrodes of transistor, non-volatile memory, volatile memory devices) and may negatively impact device performance, and/or reduction of grain coarsening or grain recrystallization in high-k dielectric gate oxides used in one or more of the semiconductor devices described above. In some embodiments, the oxide formation on metal electrodes or metal gates, for example, the metal electrode of the film stack described above, may be limited by using the exemplary thermal oxidation process at low temperatures (e.g., <700 degrees Celsius).

Alternatively, in some embodiments, the oxide layer 204 may be formed atop the surface of the substrate 202, for example, by a deposition process, such as CVD, LPCVD, PECVD, ALD, or the like. In some embodiments, the oxide layer 204 may be formed atop the surface of the substrate 202 by an LPCVD process. LPCVD processes typically utilize lower pressures that may be advantageous for preventing undesired chemical reactions in one or more precursor gases utilized to deposition the oxide layer 204 atop the substrate 202.

Using an LPCVD process, the oxide layer 204 may be deposited on the substrate 202 from a chemical vapor resulting from a desired chemical reaction of one or more precursor gases comprising a deposition gas mixture. For example, the deposition gas mixture may include one or more precursor gases, and may optionally further include a carrier gas. In some embodiments, for example, when forming an oxide layer comprising silicon oxide ($SiO_2$), the deposition gas mixture may comprises a silicon-containing gas, an oxygen-containing gas, and the carrier gas. In some embodiments, for example, when forming an oxide layer comprising hafnium oxide ($HfO_2$), the deposition gas mixture can comprise a hafnium-containing gas, an oxygen-containing gas, and the carrier gas.

Exemplary precursor gases, such as a silicon-containing gas may include, but are not limited to, one or more of silanes, halogenated silanes, and organosilanes. Exemplary oxygen-containing gases may include, but are not limited to, one or more of oxygen ($O_2$), ozone ($O_3$), or water vapor ($H_2O$). The carrier gas may include nitrogen ($N_2$), hydrogen ($H_2$), argon, helium and combinations thereof. A carrier gas may be selected based the identity of the one or more precursor gases and/or the process temperature during the deposition process. The deposition gas mixture and/or the substrate 202 may be maintained at a processing temperatures and pressures suitable for depositing the oxide layer.

In some embodiments, for example, due to the thermal oxidation or deposition processes utilized to form the oxide layer, the oxide layer 204 may include one or more defects 205 (illustrated in FIG. 2B). For example, the one or more defects 205 can be any such defect that undesirably affects the dielectric properties of the oxide layer 204. For example, defects may include structural defects, such as cracks, lattice defects, unbonded elements, deviations from ideal stoichiometry, and the like. Defects may further include impurities, for example impurities resultant from one or more of the process gases utilized to form the oxide layer 204, from the presence of materials, such as those comprising the substrate 202, or from any other source.

Next, at 106, the oxide layer 204 may be treated by exposure to a oxygen-containing plasma 206 (as illustrated in FIG. 2B). The plasma oxidation process is a second process different than the first process used to form the oxide layer 204. The inventors have discovered that plasma oxidation treatment can result in less oxide thickening of oxide films as compared to thermal oxidation processes, even at the same oxide thickness target on bare silicon. This indicates that more aggressive plasma oxidation conditions may be used for oxide film quality improvement without the undesirable thickening of the oxide layer. The inventors believe that the plasma oxidation interacts more with the bulk of the oxide, as compared to thermal oxidation processes that tend to diffuse through the oxide film and undesirably grow at the interface of the oxide film and the underlying substrate. For example, although the quality of the oxide layer can be improved by subsequent thermal oxidation of the oxide layer at higher temperatures, the inventors have noticed that a resultant amount of layer thickening caused by such thermal oxidation undesirably affects feature geometry. In addition, the increased thermal budget required by such thermal oxidation makes thermal treatment of such films less desirable.

The inventors have further discovered that exposing oxide films to a plasma treatment as described herein can advantageously improve properties of the oxide film as measured by an improved Breakdown Voltage (BV) and reduced dielectric leakage. In comparing plasma treatment of oxide films to thermal treatment of oxide films, the inventors have further unexpectedly discovered that exposing oxide films to a plasma treatment as described herein can improve oxide film properties, such as the breakdown voltage and dielectric leakage, much better than thermal oxidation treatment of oxide films. The inventors believe that the deposited oxide film improvement occurs through oxidation of the oxide film itself and brings the composition of the deposited oxide film closer to an ideal stoichiometric configuration.

The plasma 206 may be formed from a process gas including an oxygen-containing gas and, optionally, a second gas. The oxygen-containing gas may include one or more of oxygen ($O_2$), ozone ($O_3$), water vapor ($H_2O$), nitrous oxide ($N_2O$), or nitric oxide (NO). The second gas may include one or more of an inert, or noble gas (such as argon (Ar), helium (He), neon (Ne), or the like), hydrogen ($H_2$), deuterium ($D_2$), or the like. In some embodiments, the process gas may consist essentially of the oxygen-containing gas and, optionally, the second gas (e.g., the process gas does not include a substantial source of other elements, such as silicon, that would result in formation of an oxide of that element, such as silicon oxide, or the like.)

Figure 3:
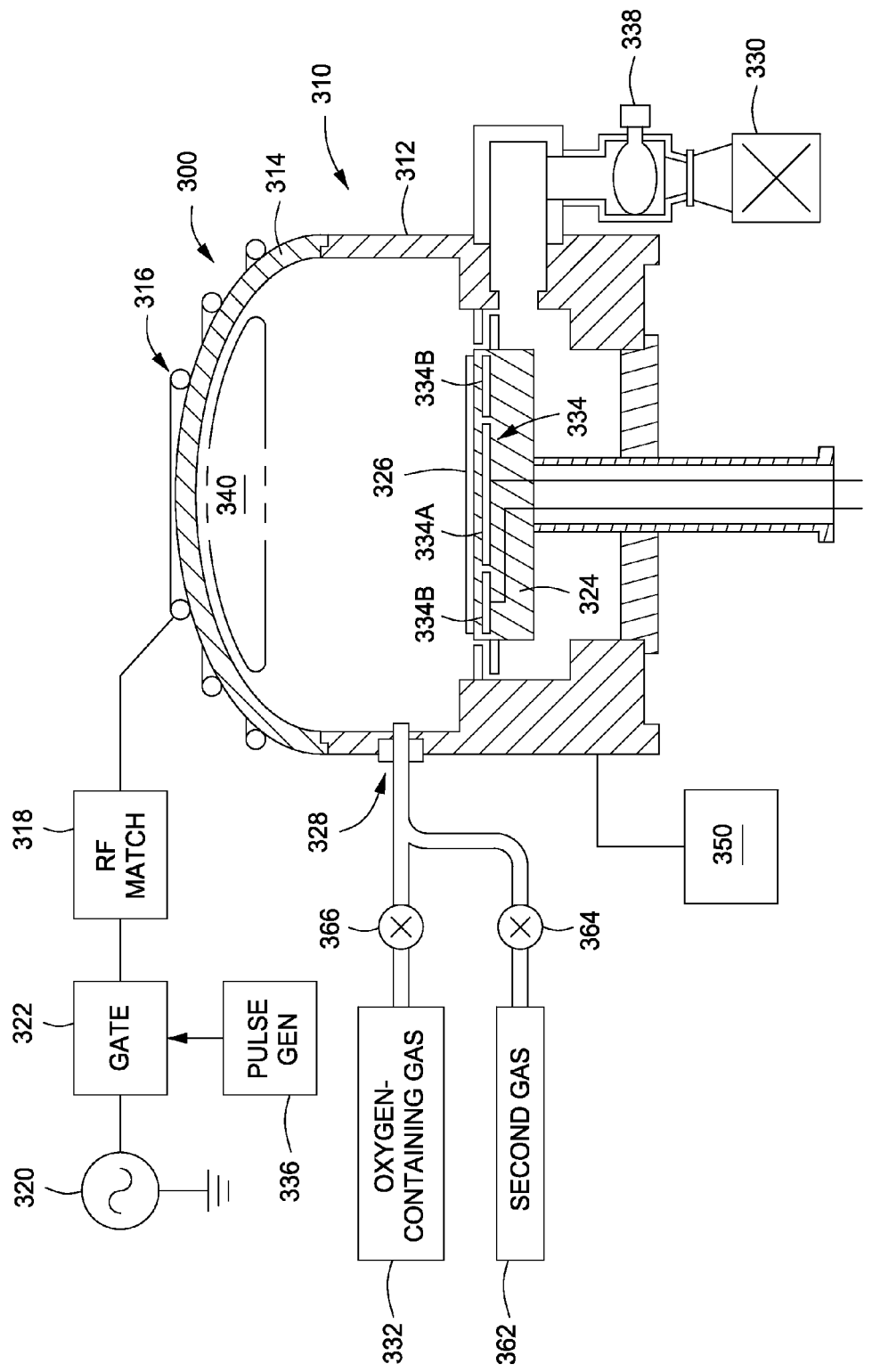
FIG. 3 illustrates a plasma reactor suitable for carrying out embodiments of the present invention.

For example, the process gas comprising the oxygen-containing gas and the second gas may be introduced into a plasma reactor, such as the plasma reactor described below with respect to FIG. 3. In some embodiments, the oxygen-containing gas may be about 100 percent of the process gas. In some embodiments, the oxygen-containing gas may be up to about 100 percent, between about 2-100 percent, up to about 50 percent, between about 2-50 percent, up to about 20 percent, between about 2-20 percent, up to about 4 percent, between about 2-4 percent, or greater than about 2 percent, of the process gas (e.g., of the total amount of oxygen ($O_2$) and second gas provided). In some embodiments, the ratio may be adjusted to control the overall thickness of the oxide layer 204.

In some embodiments, the process gas may be provided at total flow rate of between about 100-2000 sccm, or at about 150 sccm. For example, the oxygen-containing gas and the second gas may be provided at a total flow rate of between about 100-2000 sccm, or at about 150 sccm, in the percentage ranges described above. In one specific embodiment, oxygen ($O_2$) is provided at about 10 sccm and argon (Ar) is provided at about 190 sccm. The second gas may be provided to prevent recombination of the ionized oxygen-containing gas. For example, in some embodiments, the flow rate ratio of oxygen-containing gas to second gas may be decreased to facilitate higher oxidation rates based on the identity of the second gas and the processing pressure. In some embodiments, the second gas may be added to the oxygen-containing gas to sustain a plasma, such as the plasma 206 described below, during the method 100.

The plasma 206 may be generated from the process gas above to improve the quality of the oxide layer 204 (for example, as shown by the reduction of defects 205 in FIG. 2C). The plasma may be formed in a plasma reactor, such as the plasma reactor described below, capable of generating plasma at high densities, for example, between about $10^{10}$ to about $10^{11}$ ions/cm$^3$, or greater than about $10^{10}$ ions/cm$^3$.

The plasma 206 may be formed, for example in a process chamber configured for processing 300 mm diameter substrates by applying a source power up to about 5000 Watts, or between about 500 to about 2500 Watts, at suitable frequency to form a plasma (for example, in the MHz or GHz range, such as at about 13.56 MHz). In some embodiments, the plasma 206 is formed at densities of between about $10^{10}$ to about $10^{11}$ ions/cm$^3$. In some embodiments, the plasma has an ion energy of up to about 30 eV, or between about 15 to about 25 eV. The plasma may be formed in-situ, quasi-remotely, or remotely, and may be continuously applied or pulsed during operation, or in any configuration suitable to improving the quality of the oxide layer 204.

The substrate 202 may be biased while treating the oxide layer 204 with the plasma 206, for example, to control the flux of ions to the surface of the oxide layer 204, and, in some embodiments, to control additional thickness of the oxide layer 204 due to the plasma 206. In some embodiments, a bias voltage is applied to the substrate 202 at between about 50 to about 100 Volts. In some embodiments, the substrate is not biased during plasma treatment.

The plasma may be formed in a low pressure process, thereby reducing the likelihood of contamination induced defects. For example, in some embodiments, the oxide layer 230 may be formed at a pressure of about 5 mTorr, or between about 5 to about 80 mTorr, or less than about 500 mTorr. In some embodiments, ion bombardment-induced defects that might occur at such low pressure levels may be limited or prevented by using a quasi-remote plasma source as described below with respect to FIG. 3 or, optionally, by pulsing the plasma source power.

The substrate 202 may be maintained at about room temperature (about 22.5 degrees Celsius), or between about 20 to about 25 degrees Celsius, or at a temperature of between about 50-350 degrees Celsius. The low temperature of the process reduces the energy of the plasma constituents, thereby limiting diffusion of oxygen and accordingly, facilitates achieving a desired critical dimension for the oxide layer 204. The low temperature process further advantageously may promote plasma interaction with the bulk of the deposited oxide.

The plasma 206 may be utilized to treat the oxide layer 204 for any suitable duration necessary to improve layer quality (e.g., heal defects 205) while limiting increase in the thickness of the oxide layer 204. In some embodiments, the duration of the plasma process may be between about 10 to about 40 seconds, although any suitable duration, longer or shorter, may be utilized. In some embodiments, the thickness of the oxide layer 204 may increase by between about 2 to about 30 percent, or less than about 30 percent over the initial thickness of the oxide layer formed at 104 during exposure to the plasma 206.

After the exposure of the oxide layer 204 to the plasma 206 to repair the one or more defects 205 in the oxide layer 204, the method 100 generally ends. However, additional embodiments of the method 100 are possible. For example, 104 and 106 may be repeated in an iterative sequence to form the oxide layer 204 to a desired thickness. An iteration may include forming an oxide layer at 104 and exposing the oxide layer to a plasma at 106. For example, a second iteration of the method 400 may include forming a second oxide layer (not shown) atop the treated oxide layer 204 and exposing the second oxide layer to a plasma to repair one or more defects in the second oxide layer.

Embodiments of the present invention may be carried out in suitably equipped plasma reactors, such as Decoupled Plasma Oxidation (DPO) reactors available from Applied Materials, Inc., of Santa Clara, Calif. Other suitable plasma reactors may also be utilized. For example, FIG. 3 depicts an illustrative plasma reactor 300 suitable for carrying out oxide formation processes in accordance with embodiments of the present invention. The reactor 300 may provide a low ion energy plasma via an inductively coupled plasma source power applicator driven by a pulsed or continuous wave (CW) RF power generator. The reactor includes a chamber 310 having a cylindrical side wall 312 and a ceiling 314 which may be either dome-shaped (as shown in the drawing), flat, or other geometry. The plasma source power applicator comprises a coil antenna 316 disposed over the ceiling 314 and coupled through an impedance match network 318 to an RF power source consisting of an RF power generator 320 and a gate 322 at the output of the generator 320 controlled by a pulse signal having a selected duty cycle. The RF power generator 320 is configured to provide power between about 50 watts to about 5000 watts. It is contemplated that other low ion energy producing plasma source power applicators may be utilized as well, such as remote RF or microwave plasma sources.

The reactor 300 further includes a substrate support pedestal 324, such as an electrostatic chuck or other suitable substrate support, for holding a semiconductor substrate 326, for example a 200 or 300 mm semiconductor wafer or the like. The substrate support pedestal 324 typically includes a heating apparatus, such as a heater 334 beneath the top surface of the substrate support pedestal 324. The heater 334 may be a single or multiple zone heater, such as a dual radial zone heater having radially inner and outer heating elements 334A, 334B, as depicted in FIG. 3.

The reactor 300 further includes a gas injection system 328 and a vacuum pump 330 coupled to the interior of the chamber. The gas injection system 328 is supplied by one or more process gas sources, for example, an oxygen-containing gas source 332, an second gas source 362, or other suitable gas sources, for example, a carrier gas source (not shown), or the like. Flow control valves 366, 364 respectively coupled to the gas sources (e.g., the oxygen-containing gas source 332, the second gas source 362) may be utilized to selectively provide process gases or process gas mixtures to the interior of the chamber during processing. Other gas sources (not shown) for providing additional gases, such as gaseous mixtures, or the like, may also be provided. The chamber pressure may be controlled by a throttle valve 338 of the vacuum pump 330.

In some embodiments, the plasma may be pulsed. For example, the duty cycle of the pulsed RF power output at the gate 322 may be controlled by controlling the duty cycle of a pulse generator 336 whose output is coupled to the gate 322. Plasma is generated in an ion generation region 340 corresponding to a volume under the ceiling 314 surrounded by the coil antenna 316. As the plasma is formed in an upper region of the chamber 310 at a distance from the substrate 326, the plasma is referred to as a quasi-remote plasma (e.g., the plasma has benefits of remote plasma formation, but is formed within same process chamber 310 as the substrate 326.) Alternatively, a remote plasma may be utilized, in which case the ion generation region 340 may be disposed outside of the chamber 310.

The reactor 300 further includes a controller 350 coupled to the process chamber 310, and/or various components thereof (not shown), for controlling the operation thereof and comprises a central processing unit (CPU), a memory, and support circuits for the CPU. The controller 350 may control the reactor 300 directly, or via computers (or controllers) associated with particular process chamber and/or the support system components. The controller 350 may be one of any form of general-purpose computer processor that can be used in an industrial setting for controlling various chambers and sub-processors. The memory, or computer-readable medium, of the CPU may be one or more of readily available memory such as random access memory (RAM), read only memory (ROM), floppy disk, hard disk, flash, or any other form of digital storage, local or remote. The support circuits are coupled to the CPU for supporting the processor in a conventional manner. These circuits include cache, power supplies, clock circuits, input/output circuitry and subsystems, and the like. Inventive methods, such as method 100, as described herein may be stored in the memory as software routine that may be executed or invoked to control the operation of the process chamber 310 in the manner described herein. The software routine may also be stored and/or executed by a second CPU that is remotely located from the hardware being controlled by the CPU of the controller 350.

In operation, the plasma reactor 300 may be employed to carry out oxidation processes in accordance with embodiments of the present invention to form high quality oxide layers having reduced defects, such as a very low defect density, reduced bird's beak, improved dielectric properties, and the like. The defects formed by an oxidation process at low temperature or pressure may be reduced by treating the defects with an oxidative plasma. The processes may further be performed at a reduced temperature which limits diffusion, which is a significant advantage for meeting the critical dimension requirements of advanced device nodes.

While the foregoing is directed to embodiments of the present invention, other and further embodiments of the invention may be devised without departing from the basic scope thereof.

The invention claimed is:

1. A method for processing a substrate disposed on a substrate support in a process chamber, comprising:
providing a substrate having an oxide layer disposed thereon, wherein the oxide layer is formed atop the substrate in a first process; and
treating the oxide layer with a plasma oxidation process using a plasma formed from a process gas comprising an oxygen-containing gas, wherein the first process is different than the plasma oxidation process and, wherein the plasma is generated using an RF power source of up to about 5000 Watts coupled to the process chamber, and wherein the plasma has an ion energy of about 15 eV to about 25 eV.

2. The method of claim 1, wherein the oxide layer comprises silicon oxide ($SiO_2$), silicon oxynitride (SiON), hafnium oxide ($HfO_2$), or aluminum oxide ($Al_2O_3$).

3. The method of claim 1, wherein the oxide layer has one or more defects comprising at least one of cracks, lattice defects, unbonded elements, deviations from ideal stoichiometry, or impurities, and wherein treating the oxide layer with the plasma repairs the one or more defects.

4. The method of claim 1, wherein the process gas further comprises a second gas, wherein the second gas comprises at least one of hydrogen ($H_2$), deuterium ($D_2$), argon (Ar), helium (He), or neon (Ne).

5. The method of claim 1, wherein the oxygen-containing gas comprises oxygen ($O_2$), ozone ($O_3$), water vapor ($H_2O$), nitrous oxide ($N_2O$), or nitric oxide (NO).

6. The method of claim 5, wherein the oxygen-containing gas comprises up to about 50 percent of the composition of the process gas.

7. The method of claim 5, wherein the oxygen-containing gas comprises up to about 4 percent of the composition of the process gas.

8. The method of claim 1, wherein treating the oxide layer further comprises:
exposing the oxide layer to the plasma at a pressure of up to about 500 mTorr.

9. The method of claim 1, wherein treating the oxide layer further comprises:
maintaining the substrate at a temperature between about 50 to about 350 degrees Celsius.

10. The method of claim 1, wherein the oxide layer has a thickness of up to about 80 Angstroms prior to exposure to the plasma.

11. The method of claim 1, wherein treating the oxide layer increases the thickness of the oxide layer by less than about 30 percent.

12. The method of claim 1, wherein providing the substrate having the oxide layer disposed thereon comprises forming the oxide layer atop the substrate and further comprising:
repeating a sequence of forming the oxide layer atop the substrate and subsequently treating the oxide layer to form the oxide layer to a desired thickness.

13. The method of claim 1, wherein providing the substrate having the oxide layer disposed thereon comprises:
forming the oxide layer atop at least one of the substrate or one or more devices formed on the substrate.

14. The method of claim 1, wherein providing the substrate having the oxide layer disposed thereon comprises:
thermally oxidizing a surface of at least one of the substrate or one or more devices formed on the substrate to form the oxide layer.

15. A method for processing a substrate disposed on a substrate support in a process chamber, comprising:
providing a substrate having a oxide layer disposed thereon and formed by a first process, the oxide layer including one or more defects; and
exposing the oxide layer to a plasma formed from a process gas comprising an oxygen-containing gas in a second process, different than the first, to repair the one or more defects, wherein the plasma is generated using an RF power source of up to about 5000 Watts coupled to the process chamber and wherein the plasma has an ion energy of about 15 eV to about 25 eV.

16. The method of claim 15, wherein providing the substrate further comprises:
forming the oxide layer on the substrate to a desired thickness prior to exposing the oxide layer to the plasma.

17. The method of claim 15, wherein the oxide layer comprises silicon oxide ($SiO_2$), silicon oxynitride (SiON), Hafnium oxide ($HfO_2$), or aluminum oxide ($Al_2O_3$).

18. The method of claim 1, wherein the plasma is generated using an inductively coupled plasma source coupled to the process chamber.

19. The method of claim 1, wherein the plasma is a quasi-remote plasma.

* * * * *